(12) United States Patent  (10) Patent No.: US 8,441,800 B2
Sasaki et al.  (45) Date of Patent: May 14, 2013

(54) VEHICLE-MOUNTED ELECTRONIC DEVICE

(75) Inventors: Koichi Sasaki, Kanagawa (JP);
 Takayuki Ito, Kanagawa (JP); Yasunori Shiga, Kanagawa (JP)

(73) Assignee: Panasonic Corporation, Osaka (JP)

( * ) Notice: Subject to any disclaimer, the term of this patent is extended or adjusted under 35 U.S.C. 154(b) by 169 days.

(21) Appl. No.: 13/059,708

(22) PCT Filed: Mar. 15, 2010

(86) PCT No.: PCT/JP2010/001845
 § 371 (c)(1),
 (2), (4) Date: Feb. 18, 2011

(87) PCT Pub. No.: WO2010/109808
 PCT Pub. Date: Sep. 30, 2010

(65) Prior Publication Data
 US 2011/0141706 A1  Jun. 16, 2011

(30) Foreign Application Priority Data

Mar. 26, 2009 (JP) .................................. 2009-075557

(51) Int. Cl.
 *H05K 5/00* (2006.01)
(52) U.S. Cl.
 USPC ......................................................... 361/752
(58) Field of Classification Search ........................ None
 See application file for complete search history.

(56) References Cited

U.S. PATENT DOCUMENTS 5,023,752 A * 6/1991 Detter et al. .................. 361/752
6,466,451 B2 * 10/2002 Mizuno et al. ................ 361/796

(Continued)

FOREIGN PATENT DOCUMENTS

CN 1784112 A 6/2006
JP 63-093714 A 4/1988

(Continued)

OTHER PUBLICATIONS

International Search Report for PCT/JP2010/001845 dated May 18, 2010.

*Primary Examiner* — Lisa Lea Edmonds
*Assistant Examiner* — Xanthia C Cunningham
(74) *Attorney, Agent, or Firm* — Pearne & Gordon LLP

(57) ABSTRACT

Disclosed is a vehicle-mounted electronic device wherein heat generated from a heat-generating electronic device can be efficiently released without redesigning various kinds of components even if an input/output signal array for a terminal of a connector is changed. The vehicle-mounted electronic device is comprised of a lower housing (2b) having a bottom surface, a part of which is opened; a connector (3) which is projected from an opening (2c) of the lower housing (2b), and which can be connected to an outside device which inputs/outputs electric signals and an outside power source which supplies electric power; a circuit board (5) which is provided within the lower housing (2b), and is electrically connected to the connector (3) to process signals using electric signals and electric power; a metal wiring plate (7) composed of a plurality of metal wires, which is provided within the lower housing (2b) on the side adjacent to the bottom surface of the lower housing (2b), and has an end portion projected from the lower housing (2b) to electrically connect to the circuit board; and heat-generating electronic components (6), the bottom surfaces of which are coupled to a part of the metal wires in the metal wiring plate (7). The thickness of the metal wires coupled to the bottom surfaces of the heat-generating electronic components (6) in the metal wiring plate (7) is larger than the thickness of the terminal of the connector (3).

3 Claims, 7 Drawing Sheets

U.S. PATENT DOCUMENTS

| | | | |
|---|---|---|---|
| 6,965,517 B2 * | 11/2005 | Wanes et al. | 361/760 |
| 7,215,555 B2 * | 5/2007 | Takagi | 361/775 |
| 2001/0009506 A1 * | 7/2001 | Saito | 361/752 |
| 2001/0012708 A1 * | 8/2001 | Mizuno et al. | 439/76.1 |
| 2001/0017766 A1 * | 8/2001 | Murowaki et al. | 361/752 |
| 2001/0017767 A1 * | 8/2001 | Kitamura et al. | 361/752 |
| 2001/0021103 A1 * | 9/2001 | Takagi | 361/752 |
| 2002/0101724 A1 * | 8/2002 | Iwata | 361/752 |
| 2002/0180037 A1 * | 12/2002 | Shirakawa et al. | 257/727 |
| 2003/0169572 A1 * | 9/2003 | Jakob et al. | 361/752 |
| 2004/0109296 A1 * | 6/2004 | Nakayama et al. | 361/752 |
| 2005/0105253 A1 * | 5/2005 | Sakai | 361/679 |
| 2005/0231925 A1 * | 10/2005 | Fukuda et al. | 361/760 |
| 2006/0092599 A1 * | 5/2006 | Yamamura et al. | 361/611 |
| 2006/0261473 A1 * | 11/2006 | Connah et al. | 257/728 |
| 2006/0289462 A1 * | 12/2006 | Muramatsu et al. | 219/501 |
| 2007/0075419 A1 * | 4/2007 | Fukuda et al. | 257/717 |
| 2007/0076383 A1 * | 4/2007 | Sasaki et al. | 361/752 |
| 2007/0109730 A1 * | 5/2007 | Shigyo et al. | 361/600 |
| 2007/0134951 A1 * | 6/2007 | Inagaki et al. | 439/74 |
| 2007/0230143 A1 * | 10/2007 | Inagaki | 361/752 |
| 2008/0012045 A1 * | 1/2008 | Muto et al. | 257/177 |
| 2008/0076267 A1 * | 3/2008 | Oishi et al. | 438/785 |
| 2008/0158785 A1 * | 7/2008 | Murray et al. | 361/622 |
| 2009/0015976 A1 * | 1/2009 | Hara et al. | 361/64 |
| 2009/0098748 A1 * | 4/2009 | Ikeda | 439/76.1 |

FOREIGN PATENT DOCUMENTS

| | | |
|---|---|---|
| JP | 09-284951 A | 10/1997 |
| JP | 11-284370 A | 10/1999 |
| JP | 2006-128417 A | 5/2006 |
| JP | 2006-179763 A | 7/2006 |
| JP | 2008-48516 A | 2/2008 |

* cited by examiner

VEHICLE-MOUNTED ELECTRONIC DEVICE

TECHNICAL FIELD

The present invention relates to a vehicle-mounted electronic apparatus such as a control unit that accommodates a circuit substrate in a resin case.

BACKGROUND ART

With a conventional vehicle-mounted electronic apparatus, in order to miniaturize and lower the cost of a control unit, a heating block and others are made unnecessary by connecting heat-generating electronic components to a metallic wiring board (see, for example, patent literature 1). Also, with a general vehicle-mounted electronic apparatus, in order to release the heat produced by heat-generating electronic components, a heat-sink plate is insert-molded in the bottom surface of a case, and heat-generating electronic components are placed on this heat-sink plate (see, for example, patent literature 2).

CITATION LIST

Patent Literature

PTL 1
Japanese Patent Application Laid-Open No. 1999-284370
PTL 2
Japanese Patent Application Laid-Open No. 2006-179763

SUMMARY OF INVENTION

Technical Problem

However, with the molding method disclosed in patent literature 1, there is a problem of difficulty components multifunctional. This is because, with the molding method disclosed in patent literature 1, the connector-signal arrangement is fixed by insert-molding connectors and a case as one, so that, when the method of inputting and outputting electrical signals to and from connectors changes, all components of a vehicle-mounted electronic apparatus, such as a case, heat-generating electronic components and metallic wiring board need to be redesigned. By contrast with this, if a molding method is used that does not insert-mold an mounting section of heat-generating electronic components in a case and that instead places heat-generating electronic components on a circuit substrate, a vehicle-mounted electronic apparatus suffers performance deterioration due to the heat produced by heat-generating electronic components. Also, with the molding method disclosed by patent literature 2, a step of insert-molding a heat-sink plate in the bottom surface of a case to release heat is necessary, and, although the heat produced by heat-generating electronic components can be released, there is a problem of poor productivity.

In view of the above problems, it is an object of the present invention to provide a vehicle-mounted electronic apparatus that, even when the method of inputting and outputting electrical signals to and from connectors changes, makes it possible to release heat from heat-generating electronic components efficiently and makes the components of the vehicle-mounted electronic apparatus multifunctional, without redesigning various components.

Solution to Problem

In order to achieve the above object, a vehicle-mounted electronic apparatus according to the present invention has: a case, in which part of a bottom surface or side surface has an opening; a connector that sticks out from the opening of the case and that can be connected to an external device that inputs and outputs an electrical signal and an external power supply that supplies power; a circuit substrate that is provided inside the case, and that, by electrically connecting with the connector, performs signal processing using the electrical signal received as input from the external device and the power supplied from the external power supply; a metallic wiring board that comprises a plurality of metallic wires, and that is provided on an inner section on the bottom surface of the case and electrically connects with the circuit substrate; and a heat-generating electronic component that has its bottom surface connected on part of metallic wires in the metallic wiring board, and, in this vehicle-mounted electronic apparatus, the thickness of a metallic wire in the metallic wiring board that connects with the bottom surface of the heat-generating electronic component is thicker than the thickness of the connector terminal.

Advantageous Effects of Invention

With the vehicle-mounted electronic apparatus of the present invention, even when the method of inputting and outputting electrical signals to and from connectors changes, it is possible to release heat from heat-generating electronic components efficiently, without redesigning component of the vehicle-mounted electronic apparatus such as the case and metallic wiring board, or adding additional processing steps. That is to say, according to the present invention, it is possible to provide a vehicle-mounted electronic apparatus that makes components multifunctional while maintaining heat-releasing characteristics.

DESCRIPTION OF EMBODIMENTS

An embodiment of a vehicle-mounted electronic apparatus of the present invention will be described now with reference to the accompanying drawings.

Figure 1A:
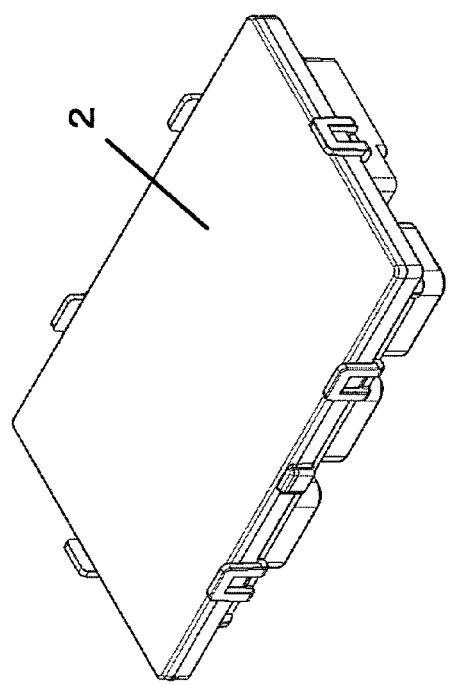
FIG. 1 is a perspective view of a vehicle-mounted electronic apparatus according to an embodiment of the present invention.
Figure 1B:
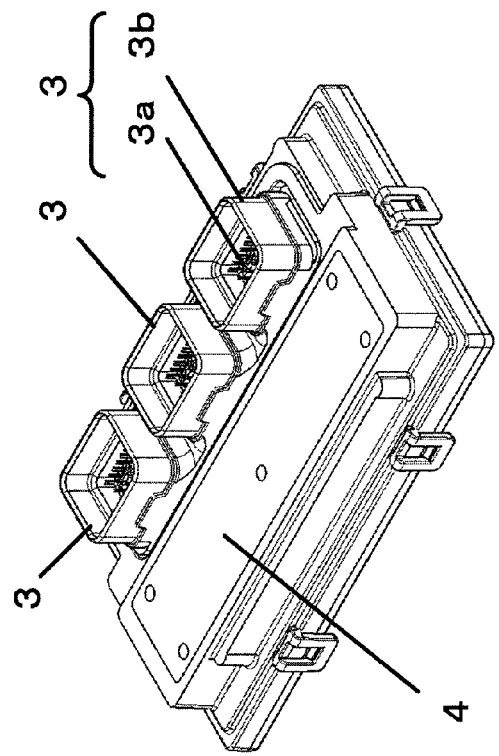

FIG. 1A is a perspective view showing a vehicle-mounted electronic apparatus according to the present invention from above. FIG. 1B is a perspective view showing a vehicle-mounted electronic apparatus according to the present invention from below.

Figure 2:
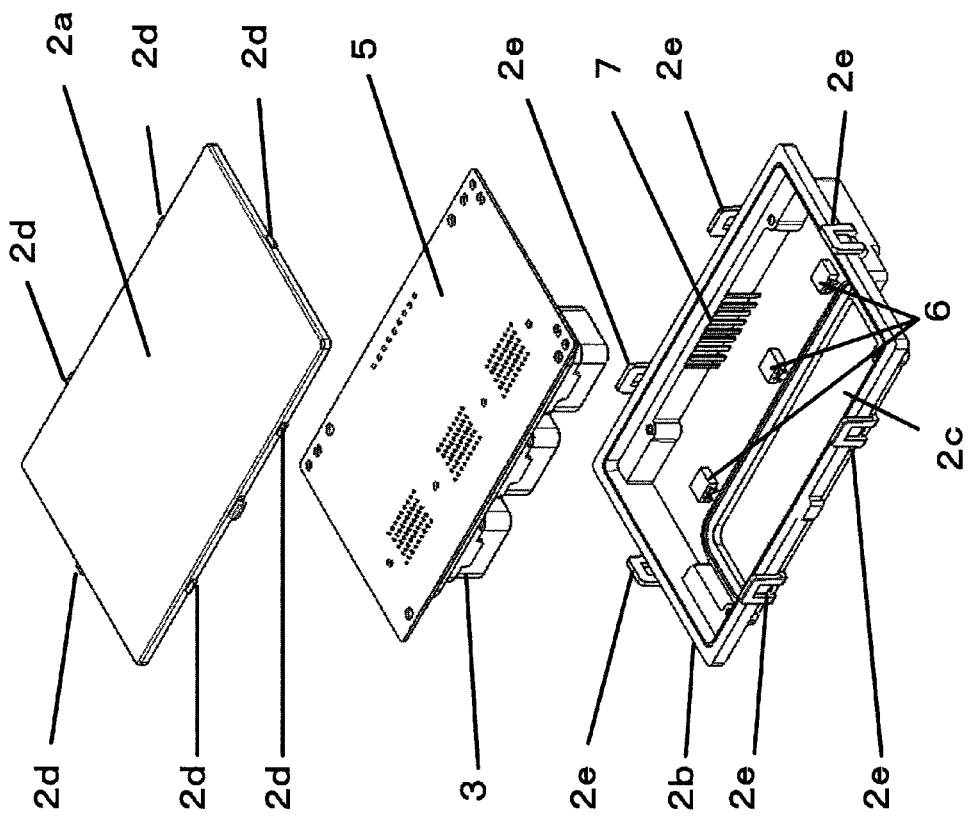
FIG. 2 is a perspective view of a vehicle-mounted electronic apparatus according the embodiment.

FIG. 2 is an exploded perspective view of a vehicle-mounted electronic apparatus according to the present invention from above;

As shown in FIG. 1 and FIG. 2, a vehicle-mounted electronic apparatus has case 2, connectors 3, heat-sink plate 4, circuit substrate 5, heat-generating electronic components 6, and metallic wiring board 7.

Case 2 is comprised of upper case 2a and lower case 2b, and is a structure to cover circuit substrate 5 in a state upper case 2a and lower case 2b are coupled. Also, case 2 is made of resin or metal. Lower case 2h has opening section 2c. Upper case 2a has hook section 2d in each side. Lower case 2b has lock section 2e in each side. When these hook section 2d and lock section 2e are fitted together, upper case 2a and lower case 2b are fixed. With the present embodiment, opening section 2c is provided in the bottom surface 2f of lower case 2b, but it is equally possible to provide opening section 2c on a side surface 2g of lower case 2b. Also, case 2 may adopt a structure that does not provide hook section 2d and lock section 2e and that instead couples upper case 2a and lower case 2b by means of a screw, for example.

Connectors 3 each have metallic terminals 3a and protecting section 3b that protects metallic terminal 3a. Metallic terminals 3a include an input terminal for receiving as input an electrical signal from an external electronic apparatus; an output terminal for outputting an electrical signal to an external electronic apparatus; a power supply terminal for connecting with a power supply and acquiring power; and a ground terminal to connect with the ground. As shown in FIG. 1B and FIG. 2, connectors 3 stick out from opening section 2c of lower case 2b.

As shown in FIG. 1B, heat-sink plate 4 is connected to the outer bottom surface of lower case 2b. This heat-sink plate 4 is made of metal having a high heat-releasing effect, and is, for example, an aluminum plate or copper plate.

Circuit substrate 5 has a signal electronic component (not shown) that performs signal processing and that has a low calorific value. This circuit substrate 5 is made of, for example, glass epoxy. Also, in this circuit substrate 5, connectors 3 and metallic terminals 3a are electrically connected by alloy-junctioning or press-fitting metallic terminals 3a in a through hole provided in one end section on the bottom surface of circuit substrate 5. Then, circuit substrate 5 receives as input an electrical signal from an external device via metallic terminal 3a of an input terminal, is supplied power from an external power supply via metallic terminal 3a of a power supply terminal, and outputs an electrical signal to an external device via metallic terminal 3a of an output terminal.

Although circuit substrate 5 and connector 3 are electrically connected via a through hole according to the present embodiment, any method of connection is possible. For example, circuit substrate 5 and connector 3 may be connected by wire bonding and suchlike means, without using a through hole.

The inner structure of lower case 2b will be described next.

Figure 3:
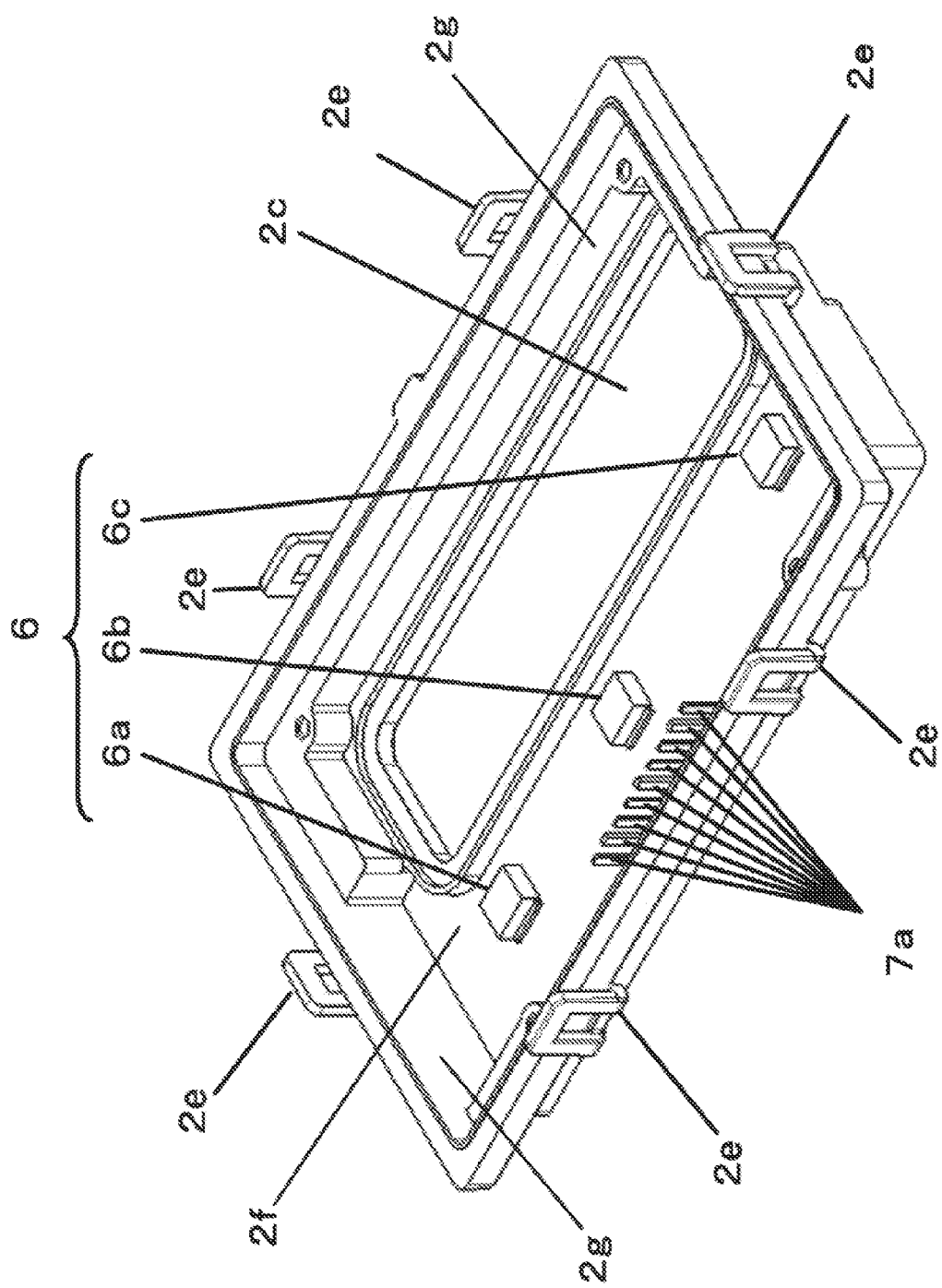
FIG. 3 is an enlarged view of a lower case, which is a principle part of a vehicle-mounted electronic apparatus according to the embodiment.

FIG. 3 is an enlarged perspective view of lower case 2b in FIG. 2. Heat-generating electronic components 6 and metallic wiring board 7 are provided in lower case 2b.

Figure 4:
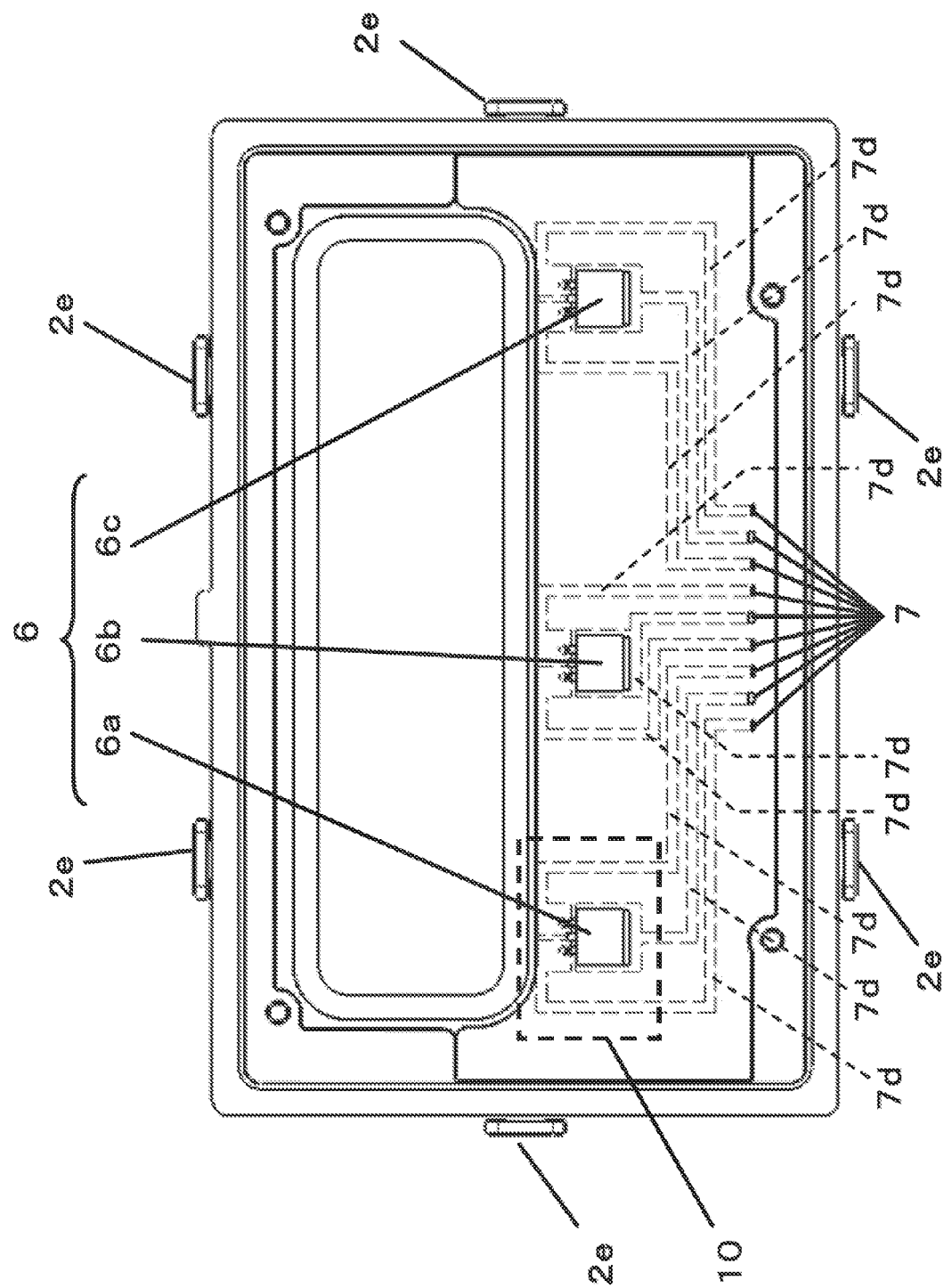
FIG. 4 illustrates a metallic wiring board provided inside a lower case according to the embodiment.

FIG. 4 illustrates metallic wiring board 7 provided inside lower case 2b, showing lower case 2b shown in FIG. 3 from above.

Heat-generating electronic components 6 are comprised of power-related electronic components of a high calorific value, such as transistors. As shown in FIG. 2 to FIG. 4, heat-generating electronic components 6 provided in lower case 2b are comprised of three heat-generating electronic components 6a, 6b and 6c. Heat-sink plate 4 is provided on the back surface of lower case 2b in which heat-generating electronic components 6 are provided.

Figure 5:
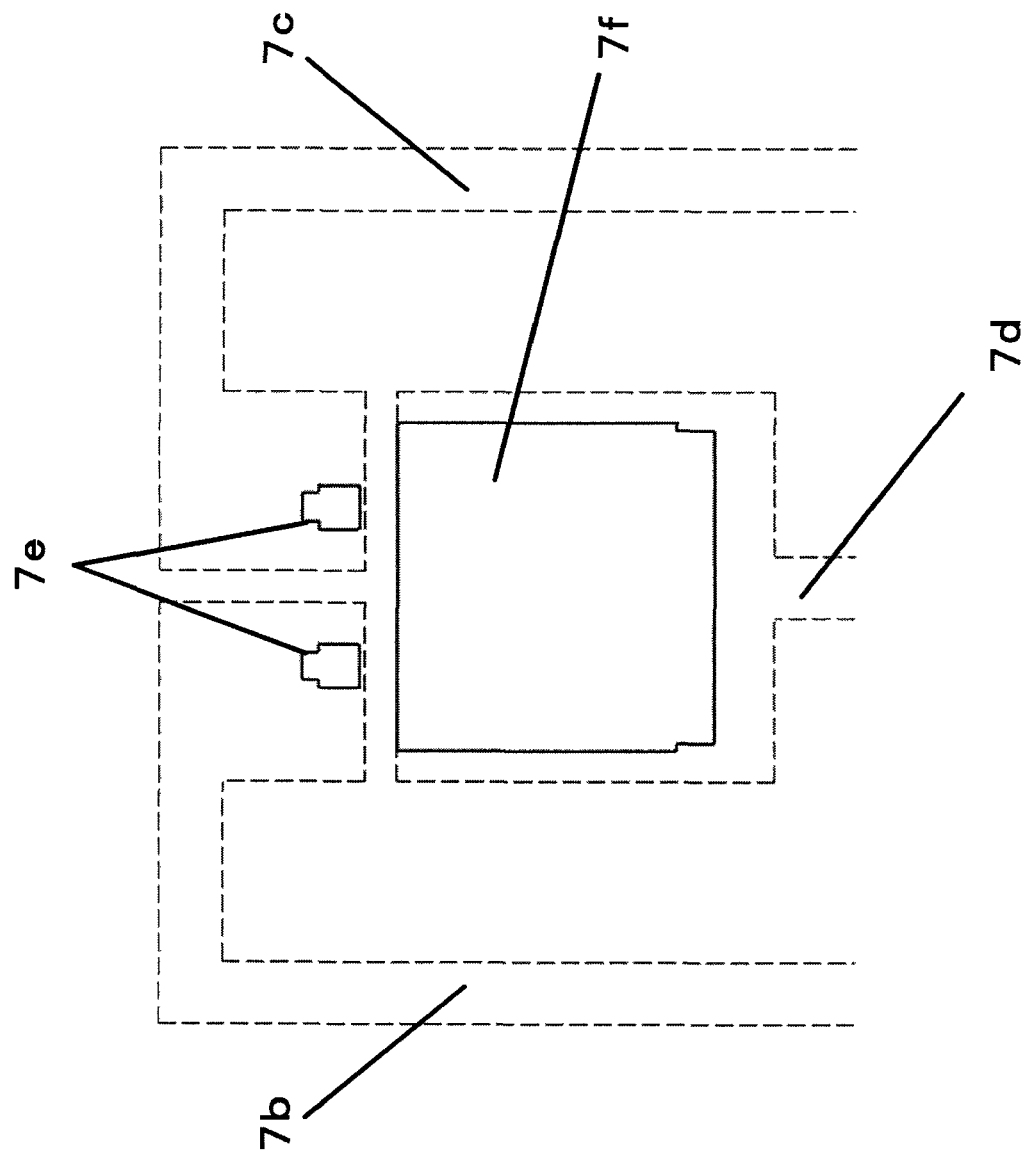
FIG. 5 illustrates a metallic wiring board according to the embodiment.

FIG. 5 is an enlarged view illustrating metallic wiring board 7 in part 10 enclosed by a dotted line in FIG. 4. In FIG. 5, electronic component 6a is removed from part 10 enclosed by a dotted line in FIG. 4, to explain metallic wiring board 7.

Figure 6:
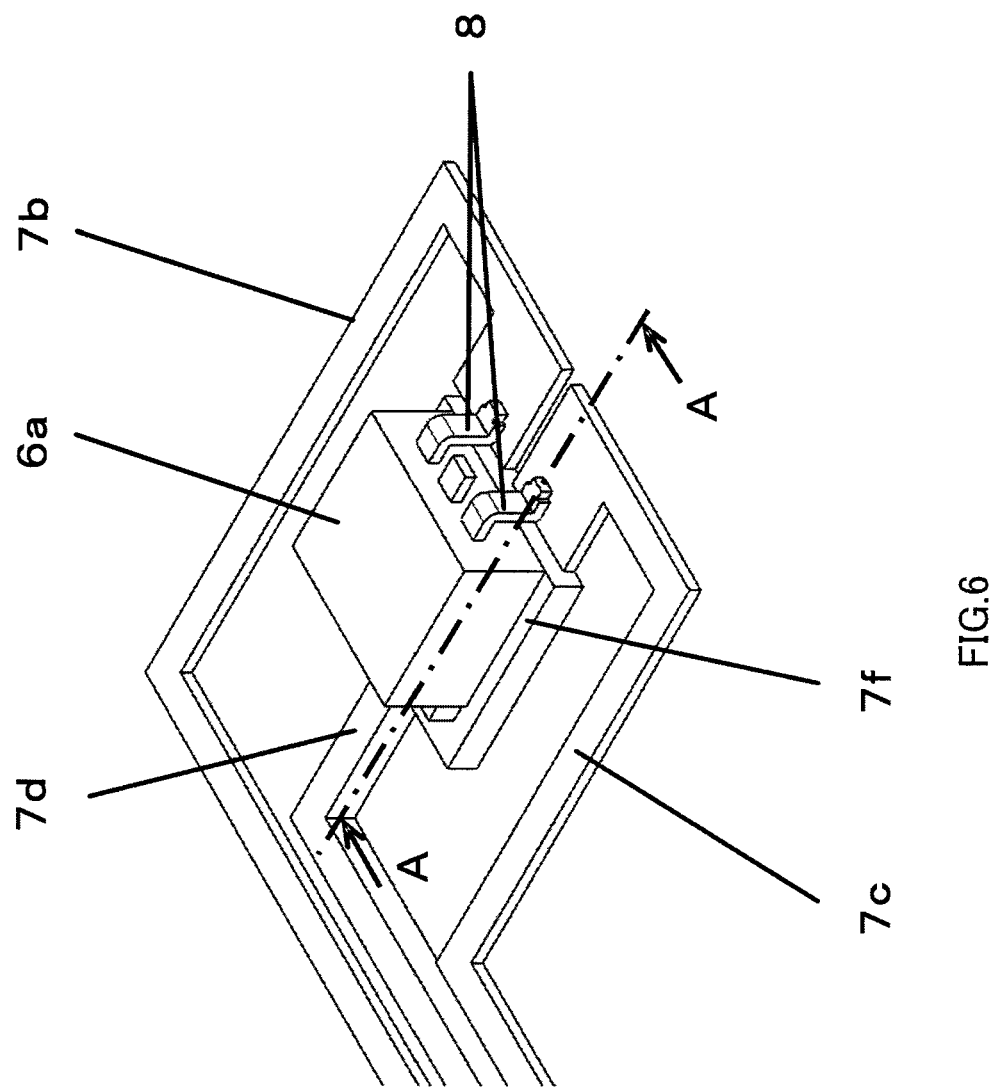
FIG. 6 is a perspective view illustrating an area around heat-generating electronic components according to the embodiment.

FIG. 6 is a perspective view for explaining an area around heat-generating electronic component 6a, showing FIG. 3 from above. In FIG. 6, lower case 2b is removed in order to explain the positional relationships between heat-generating electronic components 6a and metallic wiring board 7.

Figure 7:
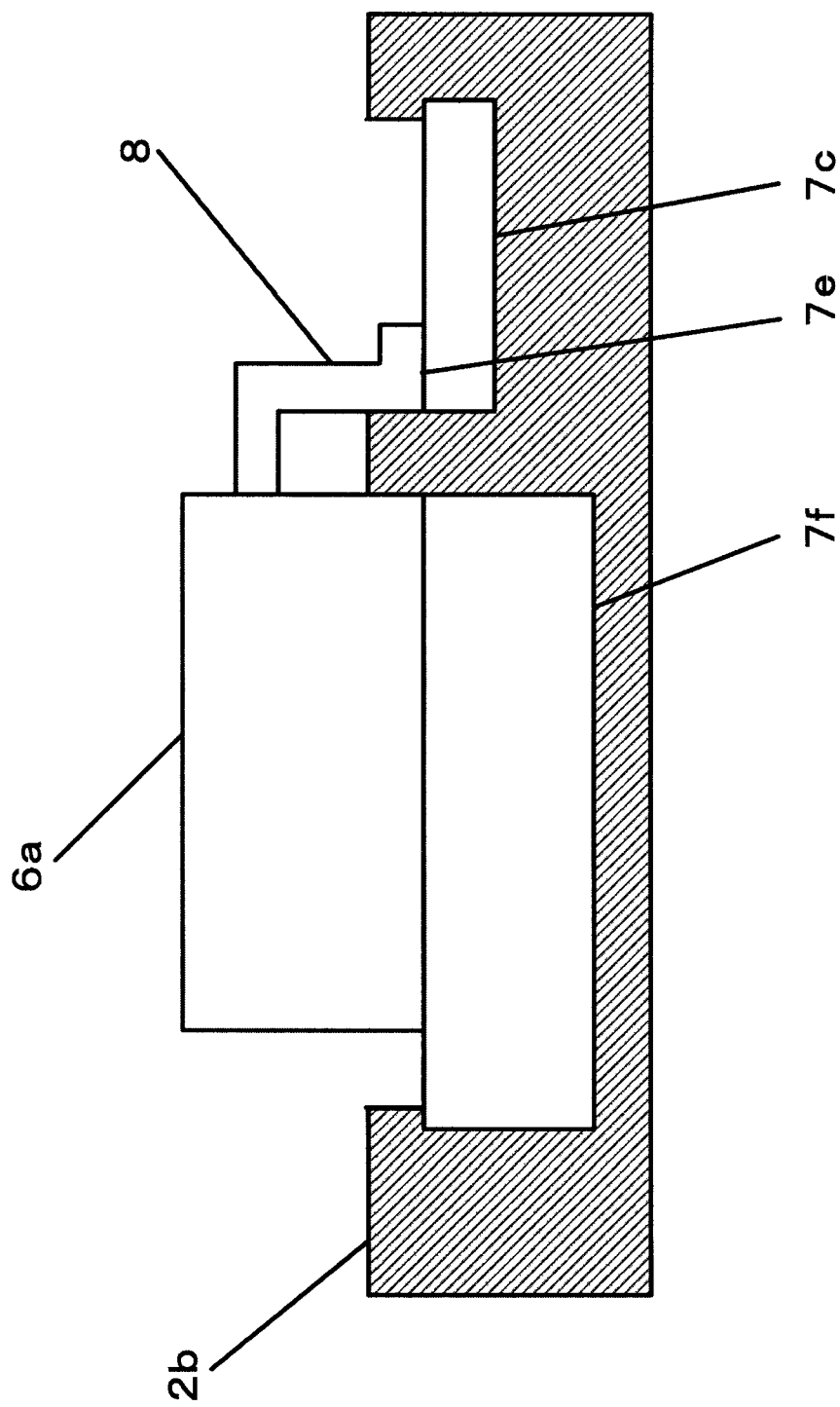
FIG. 7 is a cross-sectional view illustrating an area around heat-generating electronic components according to the embodiment.

FIG. 7 is an A-A cross-sectional view of FIG. 6. FIG. 7 will be described including lower case 2b.

FIG. 5 to FIG. 7 explain the positional relationships and connection relationships between heat-generating electronic component 6a and metallic wiring board 7. As shown in FIG. 6, heat-generating electronic component 6a has two lead terminals wire-bonded with the inner circuitry of heat-generating component 6a. The positional relationships and connection relationships between heat-generating electronic component 6a and metallic wiring board 7 shown in FIG. 5 to FIG. 7, apply alike to heat-generating electronic components 6b and 6c. Consequently, the positional relationships or connection relationships between heat-generating electronic components 6b and 6c and metallic wiring boar 7 will not be illustrated by way of drawing or explained.

Metallic wiring board 7 has a plurality of metallic wires 7d. Each metallic wire 7d is formed L-shaped (see FIG. 3). As shown in FIG. 2 and FIG. 3, end section 7a, which is one end of each metallic wire 7d formed in an L shape, sticks out nearly vertically from the bottom surface 2f of lower case 2b. This end section 7a is electrically connected with circuit substrate 5, by means of alloy-junctioning or press-fitting, in a through hole provide in the other end section on the bottom surface of circuit substrate 5.

Incidentally, although metallic wiring board 7 and circuit substrate 5 are electrically connected via a through hole according to the present embodiment, any method of connection is possible. For example, metallic wiring board 7 and circuit substrate 5 may be connected by wire bonding and suchlike means without using a through hole.

Also, as shown in FIG. 3 and FIG. 4, metallic wiring board 7 is insert-molded in lower case 2b except for end section 7a.

Metallic wiring board 7 is formed with input section 7b, output section 7c and power supplying section 7d. Input section 7b provides metallic wiring for inputting a signal from circuit substrate 5 to heat-generating electronic component 6a. Output section 7c provides metallic wiring for outputting a signal from heat-generating electronic components 6 to circuit substrate 5. Power supplying section 7d provides metallic wiring for supplying power from circuit substrate 5 to heat-generating electronic component 6a.

As shown in FIG. 5 to FIG. 7, in the front end section of input section 7b and the front end section of output section 7c—in other words, in end sections on the side of metallic wiring board 7 apart from end section 7a—connecting section 7e that exposes from lower case 2b and electrically connects with heat-generating electronic components 6a is provided. This connecting section 7e electrically connects with lead terminal 8, so that input section 7b, output section 7c and heat-generating electronic components 6a are electrically connected.

In the front end section of power supplying section 7d, mounting section 7f, where heat-generating electronic component 6a is placed and installed, is provided. This mounting section 7f is part of the upper surface of power supplying section 7d exposing from lower case 2b, as shown in FIG. 7.

When the bottom surface of heat-generating electronic component 6a is placed upon the upper surface of this mounting section 7f, power supplying section 7d and heat-generating electronic component 6a are electrically connected.

As shown in FIG. 7, mounting section 7f has a greater metal thickness than input section 7b and output section 7c. The proportion of the weight of metallic wiring board 7 in a vehicle-mounted electronic apparatus is 10% or so, for example, and therefore the weight of metallic wiring board 7 cannot be ignored. Consequently, making the metal of power supplying section 7d including mounting section 7f thicker contradicts the demand for reducing the weight of a vehicle-mounted electronic apparatus.

With the present embodiment, the metal of power supplying section 7d including to which power of a high calorific value is supplied from a power supply, is made thick, and the metal of input section 7b and output section 7c, to which electrical signals of a low calorific value is inputted from circuit substrate 5, is made thinner. By this means, it is possible to improve the heat-releasing effect while maintaining the weight of metallic wiring board 7. Consequently, with the present embodiment, it is possible to both improve heat-release performance and reduce the weight of a vehicle-mounted electronic apparatus. With the present embodiment, metallic wiring board 7 is formed an L shape, but may be formed in other shapes such as a U-shape as well.

Heretofore, when a metallic wiring board is provided inside a case forming a connector and a case as one, the thickness of the metallic wiring board depends upon the thickness of connector terminals and is usually the same thickness as the connector terminal. However, with the present embodiment, upon providing mounting section 7f, the thickness of each metallic wire in metallic wiring board 7 does not depend upon the thickness of connector terminals and can be set freely. Consequently, it is possible to improve the heat releasing effect by making the thickness of power supplying section 7d, which includes mounting section 7f where heat-generating electronic components 6 of high calorific values are mounted, thicker than metallic terminal 3a of connector 3.

On the other hand, the thickness of metallic wiring in input section 7b and output section 7c connecting with circuit substrate 5 where signal electronic components of low calorific values are mounted, can be made equal to or thinner than the thickness of metallic terminal 3a. Consequently, it is possible to improve the heat releasing effect without increasing the weight of a vehicle-mounted electronic apparatus, and reduce the weight of a vehicle-mounted electronic apparatus.

In particular, generally one hundred or more vehicle-mounted electronic apparatuses are mounted in a vehicle to control the vehicle electrically, weight reduction is possible on the order of kilograms per vehicle, so that significant improvement of mileage is possible. Also, the step if insert-molding a heat-sink plate inside a case cab be omitted, so that it is possible to improve the prevision of processing and reduce the time of processing to improve productivity.

With this structure of a vehicle-mounted electronic apparatus, an electrical signal that is received as input from an external electronic apparatus via an input terminal in metallic terminals 3a of connector 3 is subjected to signal processing using signal electronic component in circuit substrate 5. An electrical signal having been subjected to signal processing is inputted in end section 7a of input section 7b in metallic wiring board 7. An electrical signal that is inputted in input section 7b is subject to signal processing by power-supplied heat-generating electronic components 6. This supply of power is given from power supplying section 7d, via a power supply terminal in metallic terminals 3a. An electrical signal having been subjected to signal processing in heat-generating electronic components 6 is inputted in output section 7c in metallic wiring board 7. An electrical signal received as input in output section 7c is subjected to signal processing by signal electronic components in circuit substrate 5. An electrical signal having been subjected to signal processing is outputted to an external electronic apparatus via an output terminal in metallic terminals 3a of connectors 3.

The vehicle-mounted electronic apparatus of the present embodiment has a structure in which the metal thickness of a metallic wire connecting with the bottom surface of heat-generating electronic components 6 in metallic wiring board 7 of lower case 2b is thicker than the thickness of other metallic wires. Consequently, with the vehicle-mounted electronic apparatus of the present embodiment, it is possible to release heat efficiently while reducing the weight.

Furthermore, the vehicle-mounted electronic apparatus according to the present embodiment has a structure in which input and output signals to and from heat-generating electronic components 6 do not pass connectors 3 directly but instead are inputted to or outputted from connectors 3 via signal electronic components on circuit substrate 5. Consequently, with the vehicle-mounted electronic apparatus of the present embodiment, it is possible to continue using lower case 2b in which metallic wiring board 7 is insert-molded and make the components multifunctional even when the specifications of connector input-output arrangement varies between vehicle types.

Although a vehicle-mounted electronic apparatus according to the present invention is provided with a heat-sink plate to improve the heat releasing effect of heat-generating electronic components 6, it is possible to release heat as long as metallic wiring board 7 of the present invention is provided, so that it is not mandatory to provide heat-sink plate 4. By this means, it is possible to reduce the weight of a vehicle-mounted electronic apparatus. Also, it is possible to reduce the labor of processing while maintaining the heat releasing effect by metallic wiring board 7, and therefore it is possible to improve the productivity of a vehicle-mounted electronic apparatus.

Also, with the present embodiment, amongst a plurality of f metallic wires provided in metallic wiring board 7, a metallic wire that connects with the bottom surface of heat-generating electronic components 6 is made power supplying section 7d and metallic wires that connect with heat-generating electronic components 6 via lead terminal 8 are made input section 7b and output section 7c, but this is by no means limiting.

For example, it is possible to make a metallic wire that connects with the bottom surface of heat-generating electronic components 6 an input section. In this case, metallic wires connecting with heat-generating electronic components 6 via lead terminal 8 become an output section and power supplying section. Also, it is equally possible to make a metallic wire connecting with the bottom surface of heat-generating electronic component 6 an output section. In this case, metallic wires connecting with heat-generating electronic components 6 via lead terminal 8 become an input section and power supplying section. That is to say, heat-generating electronic component 6 is placed on the surface of one of an input section and an output section in metallic wiring board 7 and connects with the bottom surface. Then, in metallic wiring board 7, the thickness of a metallic wire connecting with the bottom surface of heat-generating electronic component 6 is thicker than the thickness of metallic terminal 3a of connectors 3. On the other hand, in metallic wiring board 7, the thickness of a metallic wire connecting via lead terminal 8, not connecting with the bottom surface of heat-generating electronic component 6, is thinner than the thickness of metallic terminal 3a of connectors 3.

Also, although the number of metallic wire terminals in metallic wiring board 7 to connect with one heat-generating electronic component 6 is three, this number may as well be greater than three. Also, this number of terminals may be less than three, and needs to be at least two or greater. In the event there are two terminals, metallic wiring board 7 has only an input section and an output section.

The disclosure of Japanese Patent Application No. 2009-75557, filed on Mar. 26, 2009, including the specification, drawings and abstract, is incorporated herein by reference in its entirety.

INDUSTRIAL APPLICABILITY

The vehicle-mounted electronic apparatus according to the present invention is suitable for use as a vehicle-mounted electronic apparatus having varying specifications per vehicle type.

REFERENCE SIGNS LIST

2 Case
2a Upper case
2b Lower case
2b Lower case
3a Metallic terminal
3b Protecting section
4 Heat-sink plate
5 Circuit substrate
6 Heat-generating electronic component
7 Metallic wiring board
7a End section
7b Input section
7c Output section
7d Power supplying section
7e Connecting section
7f Mounting section

The invention claimed is:

1. A vehicle-mounted electronic apparatus comprising:
a case, in which part of a bottom surface or a side surface has an opening;
a connector that sticks out from the opening of the case and that can be connected to an external device that inputs and outputs an electrical signal and an external power supply that supplies power;
a circuit substrate that is provided inside the case, on which the connector is mounted, and that, by electrically connecting with the connector, performs signal processing using the electrical signal received as input from the external device and the power supplied from the external power supply;
a metallic wiring board that comprises a plurality of metallic wires, and that is embedded in a bottom portion surface of the case and electrically connects with the circuit substrate; and
a heat-generating electronic component that has its bottom surface connected on part of metallic wires in the metallic wiring board, wherein:
the connector includes a connector terminal formed of a metal for electrical connection; and
a thickness of a metallic wire in the metallic wiring board that connects with the bottom surface of the heat-generating electronic component is thicker than thickness of the connector terminal.

2. The vehicle-mounted electronic apparatus according to claim 1, wherein the metallic wiring board comprises:
an input section that inputs a signal from the circuit substrate to the heat-generating electronic component;
an output section that outputs a signal from the heat-generating electronic component to the circuit substrate; and
a power supplying section that supplies power to the heat-generating electronic component, wherein the bottom surface of the heat-generating electronic component connects with an upper surface of one of the input section, the output section and the power supplying section.

3. The vehicle-mounted electronic apparatus according to claim 2, wherein:
an electrical signal that is received as input from the connector is inputted in the input section via the circuit substrate;
an electrical signal that is received as input in the input section is outputted to the output section via the heat-generating electronic component; and
an electrical signal outputted to the output section is outputted to the connector via the circuit substrate.

* * * * *